United States Patent [19]

Ott

[11] 4,355,283

[45] Oct. 19, 1982

[54] CIRCUIT AND METHOD FOR DUTY CYCLE CONTROL

[75] Inventor: Russell G. Ott, Cranford, N.J.

[73] Assignee: RCA Corporation, New York, N.Y.

[21] Appl. No.: 211,349

[22] Filed: Nov. 28, 1980

[51] Int. Cl.³ ............................................. H03K 5/04
[52] U.S. Cl. ...................................... 328/61; 328/58; 307/265
[58] Field of Search .................... 328/58, 61; 307/265

[56] References Cited

U.S. PATENT DOCUMENTS

| | | | |
|---|---|---|---|
| 3,697,879 | 10/1972 | Holliday | 328/61 |
| 3,805,167 | 4/1974 | Nash et al. | 328/61 |
| 4,241,418 | 12/1980 | Stanley | 307/265 X |
| 4,330,751 | 5/1982 | Swain | 328/58 |

*Primary Examiner*—John S. Heyman
*Attorney, Agent, or Firm*—Samuel Cohen; Henry I. Schanzer

[57] ABSTRACT

Circuitry responsive to an input clock (C-clock) whose duty cycle is unknown produces two clocks (A and B) in addition to the input clock. One (A-clock) of the two clocks is skewed to have a greater duty cycle than the C-clock and the other one (B-clock) of the two clocks is skewed to have a lower duty cycle than the C-clock. The two phases of each one of the A and B-clocks are compared and control signals are produced indicative of the values of the respective duty cycles and, by deduction, of the duty cycle of the C clock. The values of the control signals determine which one of the A, B, or C clocks is selected as the system clock.

10 Claims, 7 Drawing Figures

CIRCUIT AND METHOD FOR DUTY CYCLE CONTROL

This invention relates to circuitry for controlling the duty cycle of a clock signal.

In the discussion to follow, the time (duration) during which a clock signal, or repetitive pulse train, is at its high, or relatively positive, level is identified as $T_H$; the time (duration) during which the signal is at its low, or relatively negative, level is identified as $T_L$; the clock period of one full cycle of the clock signal is identified as $T$ ($=1/f$) which is equal to $T_H+T_L$; and the duty cycle (D) is arbitrarily defined as the ratio of the duration of the positive period ($T_H$) to the total clock period (T).

Systems responsive to the clock signal often require operations to occur on both phases of the clock; that is, when the clock signal is relatively positive (high) as well as when the clock signal is relatively negative (low). Where the duty cycle of the input clock signal is not controlled and may vary over a wide range (i.e. for a given T, $T_L$ and $T_H$ may have greatly different values), a problem exists in that the frequency (or clock period) of the input clock may be within the specified operating range of the system but there is insufficient time for the system to complete the operations which must be performed during one ($T_L$ or $T_H$) of the two phases of the input clock.

This problem is reduced in a system embodying the invention by not employing the "raw" input clock signal directly. The input clock is first applied to a control circuit which produces first and second clocks in addition to the input clock. The first clock has a greater duty cycle than the input clock and the second clock has a lower duty cycle than the input clock. The control circuit then passes that one of the three (the two skewed and the input) clocks whose duty cycle is closest to a predetermined value (e.g. 50%), to an output at which a system (output) clock signal is produced. It is this "system" clock which is then used to operate the system.

In the accompanying drawing like reference characters denote like components.

Figure 1:
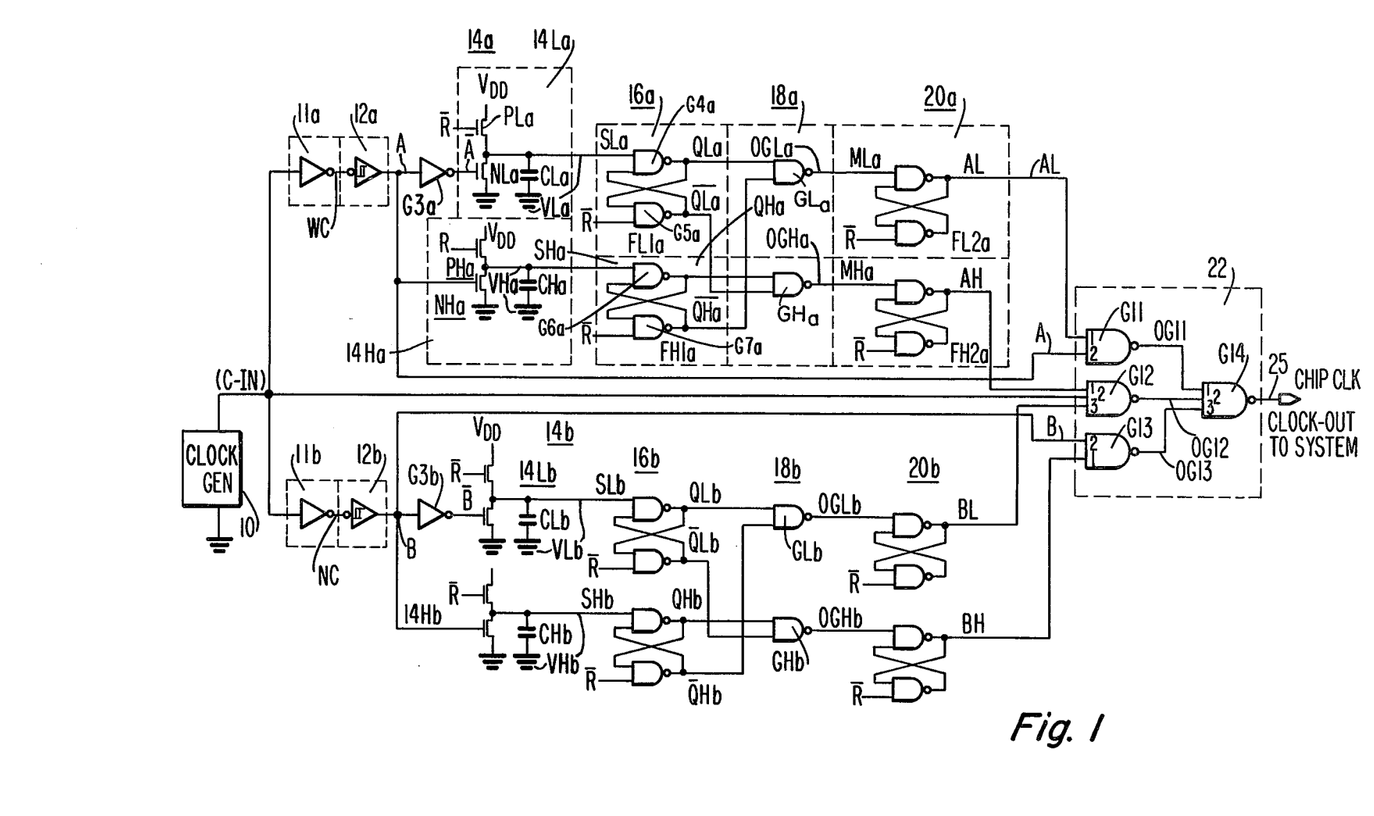
FIG. 1 is a diagram partially in block and partially in schematic form, of a circuit embodying the invention.

The circuit of FIG. 1 includes a clock generator 10 which produces at its output an Input-Clock (C-IN). The frequency (f) and clock period ($T_C$) of C-IN may be within a specified range (e.g. 10 kHz to more than 5 MHz) but the phases (low level and high level) of C-IN are not controlled. That is, the duration of the relatively positive portion ($T_{HC}$) of C-IN clock may be much more than, equal to, or much less than the duration of the relatively negative portion ($T_{LC}$) of C-IN, as shown for waveforms C in FIGS. 2A, 2B, and 2C. In the discussion to follow, the relatively positive portion (high level) of a pulse, or signal, is also referred to as its pulse width (PW). C-IN is applied to a pulse stretcher circuit 11a and to a pulse narrower circuit 11b. Circuit 11a produces at is output a signal WC whose frequency (and period) is the same as that of C-IN as shown in waveforms WC of FIGS. 2A, 2B and 2C. However, it translates the relatively positive pulse duration $T_{HC}$ to a longer relatively negative duration, as shown in waveforms WC of FIGS. 2A, 2B, and 2C. Circuit 11b produces at its output a signal NC whose frequency is also the same as that of C-IN. However, the leading edge of the negative going portion of NC has a much longer fall time than that of C-IN and this results in the subsequent production of a pulse of duration $T_{HB}$ which is shorter than the duration $T_{HC}$ of C-IN as shown in waveforms NC of FIGS. 2A, 2B and 2C.

Circuits 11a and 11b may be inverters employing complementary insulated-gate field-effect transistors (IGFETs), or any other known circuits suitably designed, to stretch and narrow, respectively, pulses applied thereto. The output of pulse stretcher 11a is fed to pulse shaper 12a and the output of pulse narrower 11b as fed to a pulse shaper 12b. Circuit 12a produces an A-clock which is wider than and has a higher duty cycle than C-IN. At the output of 12b there is produced a B-clock having a narrower pulse width and a lower duty cycle than C-IN. The A and B-clocks, shown in waveforms A and B, respectively, of FIGS. 2A, 2B, and 2C, have relatively fast rise and fall times. The pulse shapers 12a and 12b may be Schmitt trigger circuits or any one of a number of known pulse shaping circuits.

The A-clock has a ratio of $T_{HA}$ to $T_{LA}$ which is greater than that of the input clock and the B-clock has a ratio of $T_{HB}$ to $T_{LB}$ which is less than that of the input clock; where $T_{HA}$ and $T_{LA}$ are the durations of the high and low phases, respectively, of the A-clock and $T_{HB}$ and $T_{LB}$ are the durations of the high and low phases, respectively, of the B-clock. The A and B clocks are respectively fed to first and second sets of integrators and comparators to determine the ratio of the $T_H$ to $T_L$ of each one of the first and second clocks and to produce a first control signal (AH=High, AL=Low) if $T_{HA}$ is greater than $T_{LA}$, a second control signal (AH=Low, AL=High) if $T_{HA}$ is less than $T_{LA}$, a third control signal (BH=High, BL=Low) if $T_{HB}$ is greater than $T_{LB}$, and a fourth control signal (BH=Low, BL=High) if $T_{HB}$ is less than $T_{LB}$.

The A-clock is applied to an integrator 14a where first and second voltages ($V_{Ha}$ and $V_{La}$) proportional to the duration of each phase (high and low levels) of the A-clock are produced. Likewise the B-clock is applied to an integrator 14b where voltages ($V_{Hb}$ and $V_{Lb}$) proportional to the duration of each phase of the B-clock are produced. Each integrator has two sections (14Ha, 14La; and 14Hb, 14Lb); one section (14Ha, 14Hb) of each integrator is responsive to the positive level of its applied clock signal and the other section (14La, 14Lb) is responsive to the negative level of its applied clock signal. Each section has an output at which is produced a voltage level ($V_{Ha}$, $V_{La}$; and $V_{Hb}$, $V_{Lb}$) which is proportional to the duration of its applied signal.

The A-clock is directly applied to the input (gate electrode of a transistor NHa) of integrator 14Ha and via inverter G3a (at whose output is produced the $\overline{A}$-clock) to the input (gate electrode of a transistor NLa) of integrator 14La, while the B-clock is directly applied to the input (gate electrode of NHb) of integrator 14Hb and via inverter G3b (at whose output is produced the $\overline{B}$-clock) to the input (gate electrode of $N_{Lb}$) of integrator 14Lb.

The operation of the "a" portion of the circuit responsive to the A and $\overline{A}$-clocks is detailed below. The operation of the "b" portion of the circuit is similar and need not be detailed.

Integrator 14Ha is responsive to the positive portion of the A-clock and integrator 14La is responsive to the negative portion of the A-clock (i.e. the positive portion of the $\overline{A}$-clock). The output, $V_{HA}$, of section 14Ha is proportional to the high level duration, $T_{HA}$, and the output $V_{LA}$ of section 14La is proportional to the low level duration, $T_{LA}$. Each section (14Ha and 14La) of integrator 14a includes a capacitor (CHa and CLa) which is initially charged to $V_{DD}$ volts via IGFETs PLa and PHa, respectively, which are turned on when the $\overline{R}$ signal applied to their gate electrodes is low. When $\overline{R}$ is high, PLa and PHa are turned off. Then, CHa is discharged towards ground potential via the conduction path of an IGFET NLa whenever the A-clock is positive, and CLa is discharged towards ground potential via the conduction path of an IGFET NLa whenever the A-clock is negative ($\overline{A}$ is positive).

In the present system where it is desired to produce an output clock whose duty cycle (D) is close to 50%, CHa and CLa are chosen to be approximately equal to each other and NHa and NLa are chosen to have similar geometries. Also, the values of CHa and CLa and the ON impedances of NHa and NLa are selected such that at the lowest frequency of C-IN it will take several cycles to discharge capacitors CHa and CLa to a predetermined level.

Each time the A-clock is negative, CLa is discharged towards ground for a time $T_{LA}$. Similarly, each time the A-clock is positive, CHa is discharged towards ground for a time $T_{HA}$. Therefore, the potential $V_{LA}$ across CLa is proportional to $T_{LA}$, and the potential $V_{HA}$ across CHa is proportional to $T_{HA}$. As detailed below, for $T_{LA}$ greater than $T_{HA}$ there is produced at the output of a latch 20a a control signal AL which is high and a control signal AH which is low. For $T_{LA}$ less than $T_{HA}$, AL will be low and AH will be high.

Returning to the integrator, the voltage across CHa and CLa as a function of $T_{HA}$ and $T_{LA}$ may be expressed mathematically as follows:

$$\Delta V_{HA} = (I_{NHa}/CHa) \cdot T_{HA} \quad (1)$$

$$V_{HA} = V_{DD} - \Delta V_{HA} \quad (2)$$

$$\Delta V_{LA} = (I_{NLa}/CLa) \cdot T_{LA} \quad (3)$$

$$V_{LA} = V_{DD} - \Delta V_{LA} \quad (4)$$

where $I_{NHa}$ and $I_{NLa}$ are the ON currents flowing through NHa and NLa.

Figure 2A:
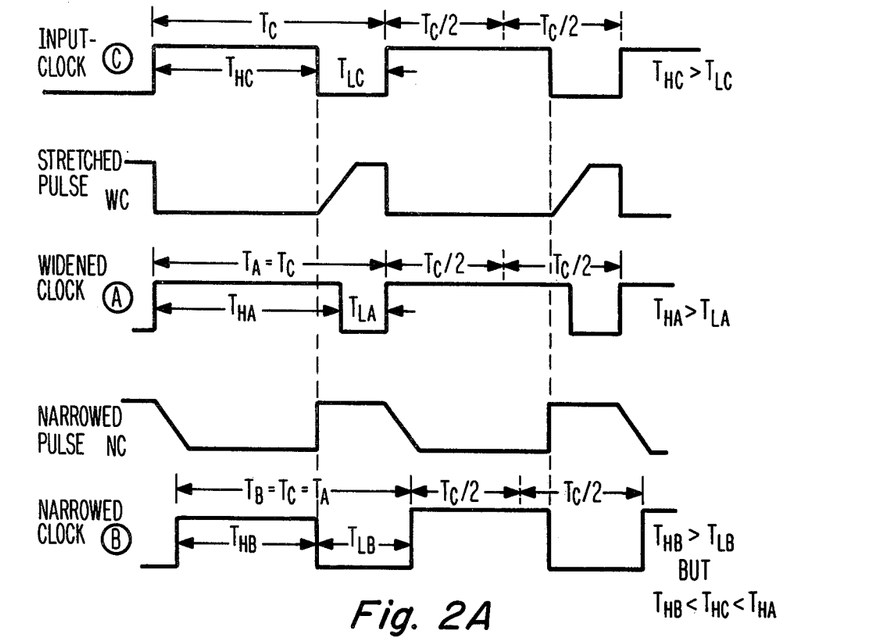
FIGS. 2A, 2B and 2C are waveforms of the input clock and of the widened and narrowed clocks generated by the circuit of FIG. 1.
Figure 2B:
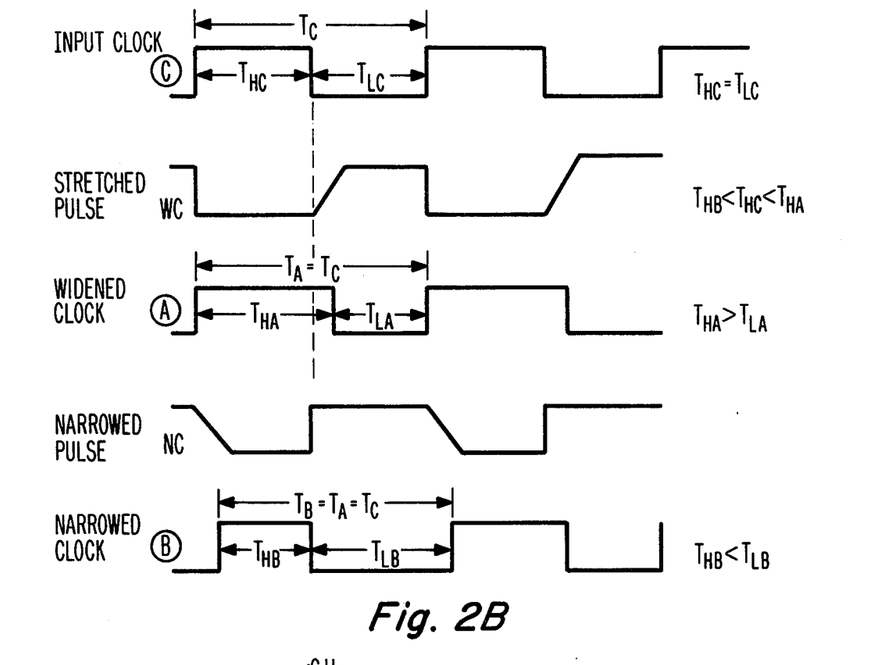
Figure 2C:
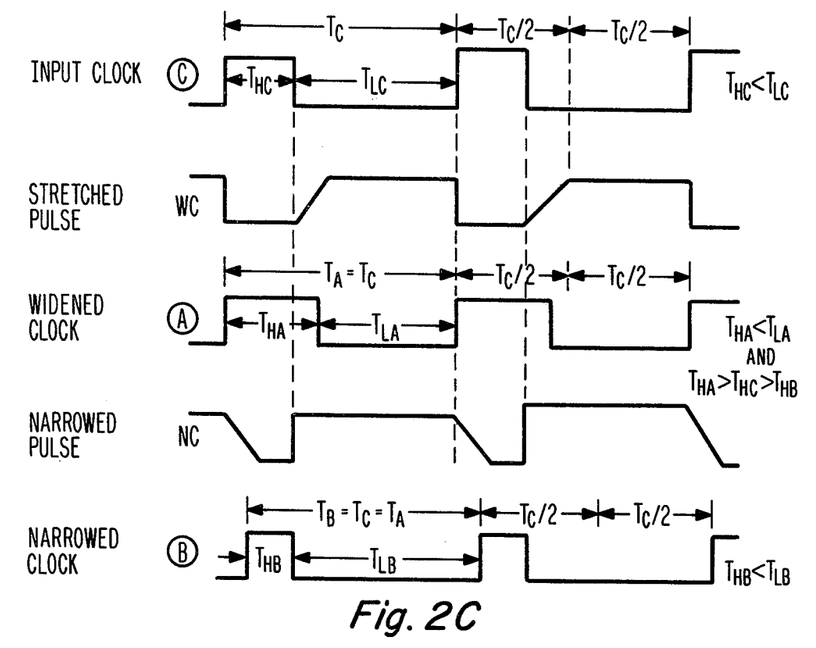

The outputs $V_{HA}$ and $V_{LA}$ of integrator 4a are respectively applied to the inputs, $S_{HA}$ and $S_{LA}$, of a comparator 16a comprised of two flip-flops, FL1a and FH1a. Each flip flop is formed by cross coupling two 2-input NAND gates (e.g. G4a, G5a; and G6a, G7a). Each flip flop has a $\overline{R}$ input, a S input, and two complementary outputs ($Q_{La}, \overline{Q}_{La}, Q_{Ha}, \overline{Q}_{Ha}$). When $\overline{R}$ is low and when $\overline{R}$ first goes high, $Q_{LA}$ and $Q_{HA}$ are low and $\overline{Q}_{HA}$ and $\overline{Q}_{LA}$ are high. This defines the initial condition of comparator 16a. After $\overline{R}$ goes high comparator 16a responds to the integrator output as follows. For the condition of $T_{LA}$ being greater than $T_{HA}$ as shown in FIG. 2C, $V_{LA}$ goes low before $V_{HA}$ goes low, $S_{La}$ goes low before $S_{Ha}$ goes low, and $Q_{La}$ is driven high and $\overline{Q}_{La}$ is driven low while $Q_{HA}$ remains low and $\overline{Q}_{HA}$ remains high. If on the other hand $T_{HA}$ is greater than $T_{LA}$ as shown in FIGS. 2A and 2B, $V_{HA}$ goes low before $T_{LA}$ goes low, $S_{HA}$ goes low before $S_{LA}$ goes low, and $Q_{Ha}$ is driven high and $\overline{Q}_{Ha}$ is driven low, while $Q_{La}$ remains low and $\overline{Q}_{La}$ remains high.

The comparator outputs are applied to the inputs of lock-out circuit 18a whose outputs (OGLa and OGHa) indicate which one of the $Q_{LA}$ and $Q_{HA}$ output of the comparator first went high after the removal of the reset signal (after $\overline{R}$ went high). The lock-out circuit 18a includes two 2-input NAND gates GLa and GHa. The two inputs to GLa are $Q_{La}$ and $\overline{Q}_{Ha}$ and the two-inputs to GHa are $\overline{Q}_{La}$ and $Q_{Ha}$. If $S_{La}$ goes low before $S_{Ha}$ goes low, $Q_{La}$ is driven high and $\overline{Q}_{La}$ low, while $Q_{Ha}$ remains low and $\overline{Q}_{Ha}$ remains high. Since $\overline{Q}_{La}$ and $Q_{Ha}$ are high, OGLa goes low. Since $Q_{La}$ is low it maintains OGHa at the high level and OGHa will be held at the high level throughout this comparison cycle; i.e. it cannot be driven low until a new comparison cycle is initiated by $\overline{R}$ going low and then high. Thus, if $S_{Ha}$ eventually goes low, that condition is locked-out of the system. If $S_{Ha}$ goes low before $S_{La}$ goes low, $Q_{Ha}$ goes high and $\overline{Q}_{Ha}$ is driven low while $Q_{La}$ is low and $\overline{Q}_{La}$ is high. Since $Q_{Ha}$ and $\overline{Q}_{La}$ are high OGHa goes low. Since $\overline{Q}_{Ha}$ is low it maintains OGLa high until a subsequent comparison cycle is initiated.

Outputs OGLa and OGHa are applied to the respective inputs MLa and MHa of a latch circuit 20a whose outputs (AL and AH) latch up to the state of the comparator output first sensed by the lock-out circuit. Latch 20a is comprised of two flip flops (FL2a, FH2a) like those of comparator 16a and need not be detailed. Each flip flop has an $\overline{R}$ input, an MLa or MHa input, and an output (AL, AH). The initial conditions established when $\overline{R}$ is low (and maintained when R first goes high) force AL and AH to be low.

After the removal of the reset signal (R is high), if OGLa goes low (OGHa is high), AL goes high and stays high while AH is low and stays low. On the other hand, if OGHa goes low and OGLa is high, AH goes high and stays high while AL remains low. Note that AH is high and AL is low due to $T_{HA}$ being of longer duration than $T_{LA}$; i.e. $T_{HA}/T_{LA} > 1$ and $\{T_{HA}/(T_{LA} + T_{HA})\} > \frac{1}{2} > 50\%$ duty cycle. Similarly, AH is low and AL is high when $T_{LA}$ is of longer duration than $T_{HA}$, i.e. $T_{HA}/T_{LA} < 1$ and $\{T_{HA}/(T_{LA} + T_{HA})\} < \frac{1}{2} < 50\%$ duty cycle.

In a similar manner to that described for the A-clock the B-clock and its complement ($\overline{B}$) are fed to integrator 14b in which voltages ($V_{HB}$ and $V_{LB}$) proportional to the duration of the two phases (positive and negative) of the B-clock are produced. The voltages are compared by means of comparator 16b whose outputs ($Q_{Lb}, \overline{Q}_{Lb}, Q_{Hb}, \overline{Q}_{Hb}$) are fed to lock-out circuit 18b whose output (OGLb, OGHb) are applied to a latch 20b having two outputs, BH and BL. BH is driven high and BL is driven low when $T_{HB}$ is of longer duration than $T_{LB}$ i.e. $T_{HB}/T_{LB} > 1$ and $\{T_{HB}/(T_{LB} + T_{HB})\} > \frac{1}{2}$. BH is driven low and BL is driven high when $T_{HB}$ is of shorter duration than $T_{LB}$; i.e. $T_{HB}/T_{LB} < 1$ and $\{T_{HB}/(T_{HB} + T_{LB})\} < \frac{1}{2}$.

Control signals AL, AH, $B_L$, and $B_H$ as well as the clock signals A, B, and C-IN are applied to an output circuit 22 having an output terminal 25 at which is produced the output clock (one of clocks A, B or C-IN fed to the system (not shown). Circuit 22 includes a 2-input NAND gate G11 having an output OG11, a 3-input NAND gate G12 having an output OG12, and a two-input NAND gate G13 having an output OG13. The outputs of G11, G12, and G13 are connected to a three-input NAND gate G14 whose output OG14 is fed to terminal 25. The control signal AL and the A-clock are applied to the two inputs of G11. The control signals AH and BL and the C-IN clock are applied to the inputs of G12. The control signal BH and the B-clock are applied to the two inputs of G13.

The output of G14 is logically equal to the B-clock when BL is low and BH is high (AL is then low and AH is high) which corresponds to the condition of $T_{HB}$ greater than $T_{LB}$. The output of G14 is logically equal to the C-IN clock when BL is high and BH is low and AL is low and AH is high which corresponds to the condition of $T_{HA}$ greater than $T_{LA}$ and $T_{HB}$ less than $T_{LB}$. The output of G14 is logically equal to the A-clock when AL is high and AH is low (BL is then high and BH is low) which corresponds to the condition of $T_{HA}$ being less than $T_{LA}$.

To best appreciate the design and operation of the output circuit recall that the A-clock is a stretched version of C-IN and the B-clock is a narrowed version of C-IN. Thus, the positive portion of the A-clock, of duration $T_{HA}$, is the widest or longest duration signal of the A, B, and C-IN clocks, and the positive portion of the B-clock, of duration $T_{HB}$, is the narrowest or shortest duration signal of the A, B, and C-IN clocks.

Figure 3A:
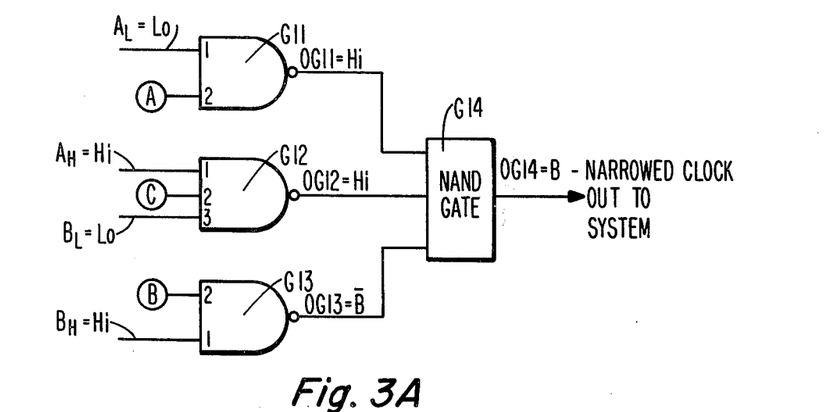
FIGS. 3A, 3B and 3C are block diagram representations of the output portion of the circuit of FIG. 1 illustrating the response of the circuit to the waveform conditions shown in FIGS. 2A, 2B and 2C, respectively.

(1) If $T_{HA}$ is less than $T_{LA}$ (i.e., $T_{HA}/T_{LA}<1$) and $(T_{HA}/T)>\frac{1}{2}$ or 50%) as illustrated in FIG. 2C then that one of the A, B, and C-IN clocks whose duty cycle is closest to 50% is the A-clock. This is so since $T_{HC}/T$, is less than $T_{HA}/T$, and $T_{HB}/T$ is less than $T_{HC}/T$; where $T=T_{HA}+T_{LA}=T_{HB}+T_{LB}=T_{LC}+T_{HC}$). Since the A-clock or a signal corresponding thereto is closest to the desired 50% duty cycle, a signal like the A-clock signal is produced as the clock output to the system. This is achieved by means of circuit 22. For $T_{HA}$ less than $T_{LA}$, AL is high and AH is low. Since, $T_{HA}$ is less than $T_{LA}$, then perforce $T_{HC}$ is less than $T_{LC}$, and $T_{HB}$ is even less than $T_{LB}$. For $T_{HB}$ less than $T_{LB}$, BL is high and BH is low. The AH input to gate G12 and the BH input to the gate G13 are low and therefore, gates G12 and G13 are inhibited, and their outputs, OG12 and OG13, are clamped to the high level. The AL input to gate G11 is high and enables G11 which then functions to invert the A-clock, which is its other input, and which produces at its output, OG11, the complement (A) of the A-clock. Three-input NAND gate G14 having the A signal applied to one of its inputs and constant high signals applied to its other two inputs inverts the A signal and produces a signal corresponding to the A-clock at its output, as illustrated in FIG. 3C.

(2) If $T_{HA}$ is greater than $T_{LA}$ (i.e. $T_{HA}/T_{LA}>1$ and $T_{HA}/T>\frac{1}{2}$) and if $T_{HB}$ is less than $T_{LB}$ (i.e. $T_{HB}/T_{LB}<1$ and $T_{HB}/T<\frac{1}{2}$) as shown in FIG. 2B, then the A-clock has a duty cycle greater than 50% and the B-clock has a duty cycle less than 50%. Since the C-IN clock lies between the A and B-clocks it will be the closest clock to 50% or sufficiently close to 50% to be acceptable. [It is possible that either A or B clock could be closer to 50% duty cycle in this case than C-IN clock. Even if this is true, however, the duty cycle of C-IN clock will also be relatively close to 50%.]

Figure 3B:
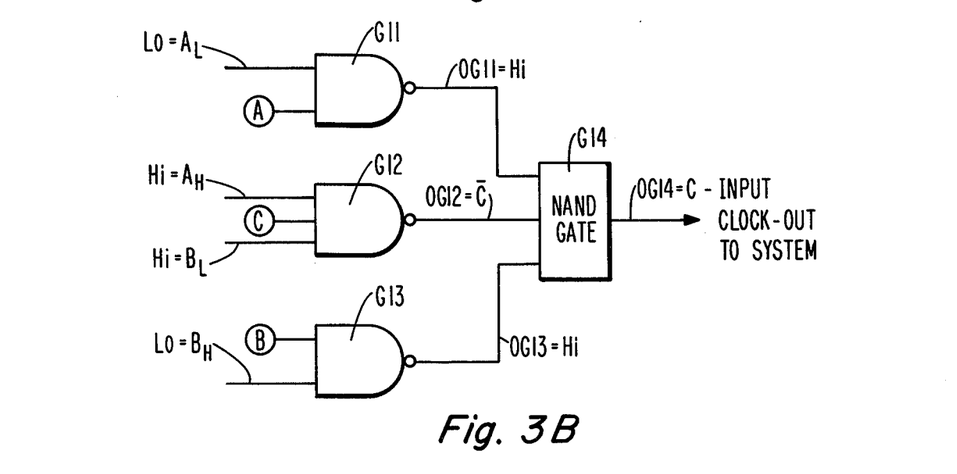
Figure 3C:
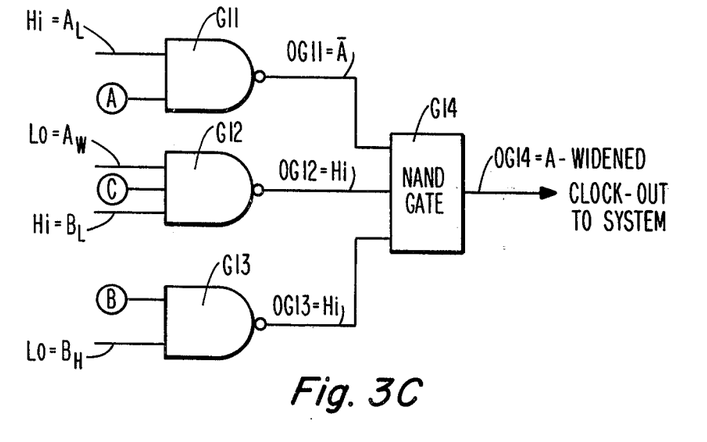

The state of the output circuit for this condition is shown in FIG. 3B. For $T_{HA}$ greater than $T_{LA}$, AL is low and AH is high. For $T_{HB}$ less than $T_{LB}$, BH is low and BL is high. The AL input to G11 is low, causing OG11 to be constantly high and, likewise, the low BH input to G13 causes OG13 to be constantly high. The AH and BL inputs of G12 are both high enabling G12 which functions as an inverter to the C-IN clock and which produces the complement (C) of the C-IN clock at its output OG12. NOR gate G14 functions to invert $\overline{C}$ and produces a signal corresponding to C-IN at its output OG14.

(3) If $T_{HB}$ is greater than $T_{LB}$ (i.e. $T_{HB}/T_{LB}>1$ and $T_{HB}/T>\frac{1}{2}$), as illustrated in FIG. 2A, then that one of the A, B, and C clocks whose duty cycle is closer to 50% is the B-clock. Since the positive portions of the B-clock of duration $T_{HB}$ has the narrowest pulse width and since $T_{HB}$ is greater than $T_{LB}$, then $T_{HC}$ must be greater than $T_{LC}$ and $T_{HA}$ must be even greater than $T_{LA}$. For $T_{HA}$ greater than $T_{LA}$, AL is low and AH is high. For $T_{HB}$ greater than $T_{LB}$, BL is low and BH is high, and the corresponding states of the output circuit are shown in FIG. 3A. The AL input to G11 is low disabling G11 and causing OG11 to be constantly high. Likewise the BL input to G12 is low disabling G12 and causing OG12 to be constant high. The BH input to G13 is high enabling G13 and causing it to function as an inverter to the B-clock which is its other input. Hence, G13 produces at its output, OG13, the complement ($\overline{B}$) of the B-clock. NAND gate G14 again functions to invert the $\overline{B}$ signal at its input and produces at its output, OG14, a signal corresponding to the B-clock.

The three conditions of interest and the corresponding signal conditions are summarized in Table I below.

TABLE I

| | AL | AH | BL | BH | Output Clock to System |
|---|---|---|---|---|---|
| 1. $T_{HB}>T_{LB}$ then $T_{HA}>>T_{LA}$ | Lo | Hi | Lo | Hi | B-Clock |
| 2. $T_{HA}>T_{LA}$ $T_{HB}<T_{LB}$ then $T_{HB}<T_{HC}<T_{HA}$ | Lo | Hi | Hi | Lo | C-Clock |
| 3. $T_{HA}<T_{LA}$ then $T_{HB}<<T_{LB}$ | Hi | Lo | Hi | Lo | A-Clock |

As discussed above, by comparing the phases of the A and B clock a determination is made of which one of the A, B and C-IN clocks has a duty cycle closest to the predetermined value (e.g. 50%). The selection of that one of the first, second and input clocks whose duty cycle is closest to a given value (e.g. 50%) is then made as discussed. Thus, the first, second and input clocks are applied to a selection circuit which is controlled by first, second, third and fourth control outputs of the comparator circuits. If condition I exists, a signal corresponding to the second clock is generated at the control circuit output; if condition II exists a signal corresponding to the input clock is generated at the control circuit output; and if condition III exists a signal corresponding to the first clock is applied to the control circuit output. Thus, the output clock which is fed to, and used to, operate the system corresponds to that one of the first, second, or input clock whose duty cycle is closest to a given value (e.g. 50%).

In the above discussion it was assumed that the desired duty cycle of the output clock was 50%. However, there are cases where more functions have to be performed during one of the two clock phases than during the other. Therefore a duty cycle other than 50% may sometime be desired. In general, the duty cycle of the output clock applied to a system may be selected to be equal, or close, to a constant K having any value greater than zero (0) [i.e. D>0%] and less than one (1) [i.e. D<100%]. As discussed below, the circuit of FIG. 1 may be used to produce an output clock whose duty cycle has a value close to K, where K may be other than ½.

The desired duty cycle of the output clock may then be expressed as:

$$T_{HO}/T = K \quad (5)$$

where $T_{HO}$ is the desired duration of the high level of the output clock. The relationship between the two phases of the output clock may then be expressed as:

$$T_{HO}/T_{LO} = K/(1-K) = Z \quad (6)$$

where $T_{LO}$ is the desired duration of the low level of the output clock and $T_{HO} + T_{LO}$ equal to the period T which is also the period of C-IN and the A and B-clocks.

To determine which one of A, B or C-IN is closest to the desired value, the integrators in FIG. 1 will then be biased to compare $T_{HA}$ versus $ZT_{LA}$ and $T_{HB}$ versus $ZT_{LB}$. This can be done, for example, by varying the capacitance ratio of CHa to CLa, and CHb to CLb, or the transistor ratio ($N_{La}$ to $N_{Ha}$ and $N_{Lb}$ to $N_{Hb}$) or controlling the value of the voltages applied to the integrator inputs.

If $T_{HA}$ is less than $ZT_{LA}$, $V_{LA}$ will be driven low prior to $V_{HA}$ being driven low, causing AL to go high and AH to go low. If $T_{HA}$ is greater than $ZT_{LA}$, $V_{HA}$ will be driven low prior to $V_{LA}$ being driven low, causing AL to go low and AH to go high.

Similarly, if $T_{HB}$ is less than $ZT_{LB}$, $V_{LB}$ will be driven low prior to $V_{HB}$ being driven low, causing BL to go high and BH to go low. If $T_{HB}$ is greater than $ZT_{LB}$, $V_{HB}$ will be driven low prior to $V_{LB}$ being driven low, causing BH to go high and BL to go low. As before, these conditions have to be evaluated to determine which one of the A, B, and C clocks should be produced at the circuit output.

(I) If $T_{HA}$ is less than $ZT_{LA}$, the A-clock must be produced at the output since it is the A-clock which has a duty cycle closest to K. $T_{HA}$ of the A-clock is longer than $T_{HC}$ which is longer than $T_{HB}$. Hence, if $T_{HA}$ is less than $ZT_{LA}$ its duty cycle will be less than K, but the duty cycles of the B and C clocks will be even smaller. Hence, the A-clock is the more desirable output and is produced at the output.

For $T_{HA}$ less than $ZT_{LA}$, AL will be high and AH will be low. Concurrently, BL will be high and BH will be low. Hence, the states of the output circuit are as shown in FIG. 3C resulting in the A-clock being applied to the system.

(II) If $T_{HA}$ is greater than $ZT_{LA}$ and if $T_{HB}$ is less than $ZT_{LB}$, then $T_{HA}/T$ is greater than K, and $T_{HB}/T$ is less than K. Consequently, $T_{HC}/T$ is close to K since it lies between $T_{HC}/T$ and $T_{HB}/T$. Hence, the C clock is the more desirable output and is to be produced at the circuit output. The conditions applied to the output circuit are as shown in FIG. 3B, AH is high, AL is low, BH is low and BL is high. Hence, the C clock or a signal corresponding thereto is produced at OG14.

(III) If $T_{HB}$ is greater than $ZT_{LB}$, the B-clock must be produced at the output. $T_{HB}$ is the narrowest or shortest width pulse since it is less than $T_{HC}$ which is narrower than $T_{HA}$. Hence, if $T_{HB}/ZT_{LB}$ is greater than one (1), $T_{HC}/ZT_{LC}$ is even greater, and $T_{HB}/ZT_{LB}$ is even still greater. Hence, the B-clock is the clock whose duty cycle is closest to K and is the one which is desirably produced at the circuit output. The state of the output circuit are as shown in FIG. 3A and the B-clock is produced at the circuit output.

The invention was illustrated using a digital comparator. However, it should be evident that a differential amplifier could be used instead. It should also be evident that integrators other than 14a and 14b could be used to practice the invention. In fact, any known means that can produce a voltage proportional to the (time) duration of a signal could be used instead. It is also evident that as noted above, the frequency range of C-IN may be very wide, its upper and lower limits being determined by the circuitry used. It should also be evident that two circuits of the type shown in FIG. 1 could be cascaded to ensure that the output clock is closer to the desired duty cycle.

What is claimed is:

1. The combination comprising:
   an input terminal adapted to receive a repetitive input signal (C) having relatively positive portion of duration $T_{HC}$, and a relatively negative portion of duration $T_{LC}$, where $T_{HC}$ plus $T_{LC}$ equal a clock period T, and where the ratio of $T_{HC}$ to T is unknown;
   a pulse stretching circuit means coupled to said input terminal and responsive to said input signal for producing a first signal (A) having a relatively positive portion of duration $T_{HA}$ longer than $T_{HC}$ and a relatively negative portion of duration $T_{LA}$, where $T_{HA} + T_{LA}$ is equal to T;
   a pulse narrowing circuit means coupled to said input terminal and responsive to said input signal for producing a second signal (B) having a relatively positive portion of duration $T_{HB}$, which is less than $T_{HC}$, and a relatively negative portion of duration $T_{LB}$, where $T_{HB} + T_{LB}$ is equal to T;
   first comparator means coupled to said pulse stretching means and responsive to said first signal (A) for comparing the duration of $T_{HA}$ to $ZT_{LA}$ and producing a first control signal if $T_{HA}$ is greater than $ZT_{LA}$ and a second control signal if $T_{HA}$ is less than $ZT_{LA}$; where $Z = K/(1-K)$ and K is a constant greater than zero and less than one;
   second comparator means coupled to said pulse narrowing circuit means and responsive to said second signal (B) for comparing the duration of $T_{HB}$ to $ZT_{LB}$ and producing a third control signal if $T_{HB}$ is greater than $ZT_{LB}$ and a fourth control signal if $T_{HB}$ is less than $ZT_{LB}$;
   an output terminal;
   output signal selection means having an output connected to said output terminal;
   means coupling said input terminal and said pulse stretching and pulse narrowing means to said output selection means for the application to the latter of said first (A), second (B), and input (C) signals; and
   means for applying said first, second, third, and fourth control signals to said output signal selection means for producing at said output terminal a signal corresponding either to:
   (a) the first (A) signal when $T_{HA}$ is less than $ZT_{LA}$;
   (b) the input (C) signal when $T_{HA}$ is greater than $ZT_{LA}$ and $T_{HB}$ is less than $ZT_{LB}$; or (c) the second (B) signal when $T_{HB}$ is greater than $ZT_{LB}$.

2. The combination as claimed in claim 1 where K is equal to one-half (½) and Z is equal to one (1).

3. The combination as claimed in claim 1 wherein each one of said first and second comparators includes an integrator for converting the time duration to a voltage level and a latch circuit for storing a predetermined voltage value.

4. The combination as claimed in claim 1 wherein each of said first and second comparators includes a first integrator section responsive to a positive portion of its associated clock signal and a second integrator section responsive to the negative portion of its associated signal.

5. The combination as claimed in claim 4 wherein each one of said first and second comparators includes a latch connected at its input to its associated integrator.

6. The combination as claimed in claim 5 wherein said output signal selection means includes a first two input NAND gate to which is applied one of said first and second control signals and said first signal a second two input NAND gate to which is applied one of said third and fourth control signals and said second signal; and a three input NAND gate to which is applied the other one of said first and second control signals, the other one of said third and fourth control signals and said input signal.

7. In response to a repetitive input signal (C) whose period ($T_C$) is known but whose duty cycle ($T_{HC}/T_C$) is undefined, where $T_{HC}$ and $T_{LC}$ are respectively equal to the duration of the relatively positive and relatively negative portions of the signal, and $T_{LC}+T_{HC}=T_C$, a method for producing an output signal which is closer, or equal, to a desired signal having a relatively positive portion for a duration $T_{HO}$ and a relatively negative portion for a duration $T_{LO}$, where $T_{HO}+T_{LO}=T_O=T_C$ and where $T_{HO}/T_O=K$ and $T_{HO}/T_{LO}=K/(1-K)=Z$ where K is greater than O and less than 1, comprising the steps of:

(a) changing in one sense the duty cycle of the input signal to provide a first signal whose relatively positive portion has a period $T_{HA}>T_{HC}$ and whose relatively negative portion has a period $T_{LA}<T_{LC}$, where $T_{HA}+T_{LA}=T_C$;

(b) changing in an opposing sense the duty cycle of the input signal to provide a second signal whose relatively positive portion has a period $T_{HB}$ which is less than $T_{HC}$ and whose relatively negative portion has a period $T_{LB}$ which is greater than $T_{LC}$ where $T_{HB}+T_{LB}=T_C$;

(c) comparing the duration of $T_{HA}$ to $ZT_{LA}$ and producing a first control signal if $T_{HA}$ is greater than $ZT_{LA}$ and a second control signal if $T_{HA}$ is less than $ZT_{LA}$;

(d) comparing the duration of $T_{HB}$ to $ZT_{LB}$ and producing a third control signal if $T_{HB}$ is greater than $ZT_{LB}$ and a fourth control signal if $T_{HB}$ is less than $ZT_{LB}$; and (e) producing an output signal corresponding to either:

(1) the first (A) signal when $T_{HA}$ is less than $ZT_{LA}$;

(2) the input signal (C) when $T_{HA}$ is greater than $ZT_{LA}$ and $T_{HB}$ is less than $ZT_{LB}$; or (3) the second (B) signal when $T_{HB}$ is greater than $ZT_{LB}$.

8. The method as claimed in claim 7 wherein K=½ and Z=1.

9. The combination comprising:

an input terminal adapted to receive a repetitive input signal (C) having a relatively high level for a duration $T_{HC}$, and a relatively low level for a duration $T_{LC}$, where $T_{HC}$ plus $T_{LC}$ equal a clock period T, and where the ratio of $T_{HC}$ to T is unknown;

a pulse stretching circuit means coupled to said input terminal and responsive to said input signal for producing a first signal (A) having a positive portion of duration $T_{HA}$ longer than $T_{HC}$ and a negative portion of duration $T_{LA}$, where $T_{HA}+T_{LA}$ is equal to T;

a pulse narrowing circuit means coupled to said input terminal and responsive to said input signal for producing a second signal (B) having a positive portion of duration $T_{HB}$, which is less than $T_{HC}$, and a negative portion of duration $T_{LB}$, where $T_{HB}+T_{LB}$ is equal to T;

first comparator means coupled to said pulse stretching means and responsive to said first signal (A) for comparing its positive duration $T_{HA}$ to its negative duration ($T_{LA}$) and producing a first set of control signals indicative of the ratio of $T_{HA}$ to $T_{LA}$;

second comparator means coupled to said pulse narrowing circuit means and responsive to said second signal (B) for comparing its positive duration $T_{HB}$ to its negative duration $T_{LB}$ and producing a second set of control signals indicative of the ratio of $T_{HB}$ to $T_{LB}$;

an output terminal;

means coupled to said input terminal and to said pulse stretching pulse narrowing means and responsive to said first and second sets of control signals for producing at said output terminal a signal corresponding to one of said first, second or input clocks.

10. A circuit for producing a system clock signal having a desired duty cycle, that is, a desired ratio between the time duration of its relatively positive portion and the time duration of its entire clock period, comprising:

means responsive to an input clock signal having a relatively positive portion of time duration $T_H$ and a duty cycle $T_H/T$, where T is the duration of the clock signal period, for producing a first clock signal A of the same frequency as the input clock signal and having an increased duty cycle $T_{HA}/T$, where $T_{HA}$ is greater than $T_H$ and is the time duration of the relatively positive portion of the first clock signal;

means responsive to said input clock signal for producing a second clock signal of the same frequency as the input clock signal and having a decreased duty cycle $T_{HB}/T$, where $T_{HB}$ is less than $T_H$ and is the time duration of the relatively positive portion of the second clock signal;

means for comparing $T_{HA}$ with $Z\,T_{LA}$ to obtain a first control signal manifestation indicative of their relative values, where Z is a constant and $T_{LA}$ is the time duration of the relatively negative portion of the first clock signal;

means for comparing $T_{HB}$ with $Z\,T_{LB}$ to obtain a second control signal manifestation indicative of their relative values, where $T_{LB}$ is the time duration of the relatively negative portion of the second clock signal; and means responsive to said first and said second control signal manifestations for selecting one of said input, first (A) or second (B) clock signals as said system clock signal.

* * * * *

UNITED STATES PATENT AND TRADEMARK OFFICE
CERTIFICATE OF CORRECTION

PATENT NO. : 4,355,283
DATED : October 19, 1982
INVENTOR(S) : Russell G. Ott

It is certified that error appears in the above-identified patent and that said Letters Patent is hereby corrected as shown below:

Col. 3, line 21 "(A is positive)" should be ---($\overline{A}$ is positive)---.

Col. 4, line 38 "(R is high)" should be --- ($\overline{R}$ is high)---.

Col. 5, line 49 "(A)" should be --- ($\overline{A}$) ---.

Col. 5, line 50 "A" should be --- $\overline{A}$ ---.

Col. 5, line 51 "A" should be --- $\overline{A}$ ---.

Col. 6, line 3 delete the word "of" and insert --- to ---.

Signed and Sealed this

First Day of March 1983

[SEAL]

Attest:

GERALD J. MOSSINGHOFF

*Attesting Officer*     *Commissioner of Patents and Trademarks*